(12) United States Patent
Lochun et al.

(10) Patent No.: US 6,824,857 B2
(45) Date of Patent: Nov. 30, 2004

(54) CIRCUIT ELEMENTS HAVING AN EMBEDDED CONDUCTIVE TRACE AND METHODS OF MANUFACTURE

(75) Inventors: Darren Lochun, Milford, NH (US); John J. Ireland, Exeter, NH (US)

(73) Assignee: Nashua Corporation, Nashua, NH (US)

( * ) Notice: Subject to any disclaimer, the term of this patent is extended or adjusted under 35 U.S.C. 154(b) by 12 days.

(21) Appl. No.: 10/113,733

(22) Filed: Apr. 1, 2002

(65) Prior Publication Data

US 2002/0171065 A1 Nov. 21, 2002

Related U.S. Application Data

(60) Provisional application No. 60/280,952, filed on Apr. 2, 2001, and provisional application No. 60/292,401, filed on May 21, 2001.

(51) Int. Cl.[7] .................................................. B32B 15/00
(52) U.S. Cl. ........................ 428/209; 428/901; 428/402; 428/426; 428/441; 428/446; 428/473.5; 428/480; 428/500; 428/515; 428/520; 428/521; 428/522; 361/748; 361/751
(58) Field of Search ................................. 428/209, 901, 428/402–403, 426, 441, 446, 473.5, 480, 500, 515, 520, 521, 522, 430, 211, 546, 935, 458, 462; 361/748, 751

(56) References Cited

U.S. PATENT DOCUMENTS

| | | | |
|---|---|---|---|
| 2,724,674 A | 11/1955 | Pritikin | 154/95 |
| 2,823,146 A | 2/1958 | Roberts et al. | 117/212 |
| 3,808,680 A | 5/1974 | Iafrate et al. | 29/625 |
| 3,879,572 A | 4/1975 | Shoji et al. | 174/68.5 |
| 3,913,219 A | 10/1975 | Lichtblau | 29/592 |
| 3,937,857 A | 2/1976 | Brummett et al. | 427/98 |
| 3,954,570 A | 5/1976 | Shirk et al. | 204/15 |
| 3,957,694 A | 5/1976 | Bolon et al. | 252/514 |
| 3,988,647 A | 10/1976 | Bolon et al. | 316/101 B |
| 4,006,047 A | 2/1977 | Brummett et al. | 156/656 |
| 4,088,801 A | 5/1978 | Bolon et al. | 427/54 |

(List continued on next page.)

FOREIGN PATENT DOCUMENTS

| | | | | |
|---|---|---|---|---|
| EP | 0140585 | 5/1985 | | H01B/1/22 |
| EP | 0 471 386 A2 | 2/1992 | | |
| JP | 02027791 | 1/1990 | | |
| JP | 5-222326 | 8/1993 | | C09D/11/02 |
| JP | 5-327185 | 12/1993 | | H05K/3/20 |
| JP | 0923952 | 11/1997 | | |
| WO | WO 95/11129 | 4/1995 | | |
| WO | 97/48257 | 12/1997 | | H05K/3/12 |
| WO | 00/33625 | 6/2000 | | H05K/1/09 |

OTHER PUBLICATIONS

Patent Cooperation Treaty, International Search Report, International Application No. PCT/US 02/10208, mailed on Jun. 28, 2002, 8 pages.

(List continued on next page.)

*Primary Examiner*—Deborah Jones
*Assistant Examiner*—Ling Xu
(74) *Attorney, Agent, or Firm*—Testa, Hurwitz & Thibeault, LLP

(57) ABSTRACT

Disclosed is a circuit element that includes a thermoplastic substrate and a conductive trace at least partially embedded in the thermoplastic substrate. Also disclosed is a method of forming a circuit element. The method includes the steps of providing a thermoplastic substrate having a softening temperature, printing a conductive ink onto the thermoplastic substrate to form a trace, and embedding the trace into the thermoplastic substrate by heating the thermoplastic substrate to a temperature above about the softening temperature about the trace.

21 Claims, 6 Drawing Sheets

U.S. PATENT DOCUMENTS

| | | | |
|---|---|---|---|
| 4,100,037 A | 7/1978 | Baron et al. | 204/15 |
| 4,248,921 A | 2/1981 | Steigerwald et al. | 428/148 |
| 4,278,702 A | 7/1981 | Jenq | 427/45.1 |
| 4,327,124 A | 4/1982 | DesMarais, Jr. | 427/96 |
| 4,368,281 A | 1/1983 | Brummett et al. | 523/458 |
| 4,369,269 A | 1/1983 | Harper et al. | 523/459 |
| 4,369,557 A | 1/1983 | Vandebult | 29/25.42 |
| 4,387,115 A | 6/1983 | Kitamura et al. | 252/518 |
| 4,406,826 A | 9/1983 | Morgan et al. | 252/512 |
| 4,457,861 A | 7/1984 | DesMarais, Jr. | 252/512 |
| 4,495,546 A | 1/1985 | Nakamura et al. | 361/398 |
| 4,496,607 A | 1/1985 | Mathias | 427/53.1 |
| 4,517,739 A | 5/1985 | Lenaerts et al. | 29/846 |
| 4,518,833 A | 5/1985 | Watkins | 200/5 A |
| 4,522,888 A | 6/1985 | Eichelberger et al. | 428/546 |
| 4,560,445 A | 12/1985 | Hoover et al. | 204/15 |
| 4,581,301 A | 4/1986 | Michaelson | 428/551 |
| 4,595,604 A | 6/1986 | Martin et al. | 427/96 |
| 4,595,605 A | 6/1986 | Martin et al. | 427/96 |
| 4,634,623 A | 1/1987 | Watkins | 428/208 |
| 4,668,533 A | 5/1987 | Miller | 427/98 |
| 4,670,351 A | 6/1987 | Keane et al. | 428/549 |
| 4,677,017 A | 6/1987 | DeAntonis et al. | 428/214 |
| 4,682,415 A | 7/1987 | Adell | 29/846 |
| 4,853,252 A | 8/1989 | Fränkel et al. | 427/53.1 |
| 4,921,623 A | 5/1990 | Yamaguchi et al. | 252/512 |
| 5,006,397 A | 4/1991 | Durand | 428/209 |
| 5,059,242 A | 10/1991 | Firmstone et al. | 106/1.23 |
| 5,061,551 A | 10/1991 | Durand | 428/209 |
| 5,062,916 A | 11/1991 | Aufderheide et al. | 156/269 |
| 5,082,734 A | 1/1992 | Vaughn | 428/411.1 |
| 5,098,771 A | 3/1992 | Friend | 428/209 |
| 5,131,141 A | 7/1992 | Kawaguchi | 29/853 |
| 5,218,168 A | 6/1993 | Mitchell et al. | 174/52.4 |
| 5,227,223 A | 7/1993 | Morgan et al. | 428/209 |
| 5,232,767 A | 8/1993 | Hisazumi et al. | 428/213 |
| 5,270,368 A | 12/1993 | Lent et al. | 524/236 |
| 5,286,415 A | 2/1994 | Buckley et al. | 252/502 |
| 5,340,640 A | 8/1994 | Bientz | 428/206 |
| 5,344,591 A | 9/1994 | Smuckler | 252/511 |
| 5,366,760 A | 11/1994 | Fujii et al. | 427/96 |
| 5,385,787 A | 1/1995 | Minten | 428/447 |
| 5,389,403 A | 2/1995 | Buckley et al. | 427/372.2 |
| 5,403,649 A | 4/1995 | Morgan et al. | 428/209 |
| 5,407,473 A | 4/1995 | Miura et al. | 106/20 B |
| 5,437,916 A | 8/1995 | Morgan et al. | 428/209 |
| 5,442,334 A | 8/1995 | Gallo et al. | 340/572 |
| 5,461,202 A | 10/1995 | Sera et al. | 174/254 |
| 5,461,775 A | 10/1995 | Tanabe et al. | 29/840 |
| 5,622,652 A | 4/1997 | Kucherovsky et al. | 252/511 |
| 5,645,932 A | 7/1997 | Uchibori | 428/347 |
| 5,681,441 A | 10/1997 | Svendsen et al. | 205/114 |
| 5,733,598 A | 3/1998 | Sera et al. | 427/96 |
| 5,758,575 A | 6/1998 | Isen et al. | 101/153 |
| 5,761,801 A | 6/1998 | Gebhardt et al. | 29/846 |
| 5,763,058 A | 6/1998 | Isen et al. | 428/209 |
| 5,792,594 A | 8/1998 | Brown et al. | 430/315 |
| 5,882,722 A | 3/1999 | Kydd | 427/123 |
| 5,928,767 A | 7/1999 | Gebhardt et al. | 428/209 |
| 5,935,640 A | 8/1999 | Ferrier et al. | 427/98 |
| 5,951,918 A | 9/1999 | Kuwajima et al. | 252/514 |
| 5,956,060 A | 9/1999 | Zaba et al. | 347/76 |
| 5,973,598 A | 10/1999 | Beigel | 340/572.1 |
| 6,010,771 A | 1/2000 | Isen et al. | 428/209 |
| 6,014,805 A | 1/2000 | Buixadera Ferrer | 29/852 |
| 6,027,762 A | 2/2000 | Tomita et al. | 427/96 |
| 6,036,889 A | 3/2000 | Kydd | 252/512 |
| 6,076,723 A | 6/2000 | I-Tsung Pan | 228/33 |
| 6,084,007 A | 7/2000 | Narukawa et al. | 523/161 |
| 6,104,311 A | 8/2000 | Lastinger | 340/825.54 |
| 6,137,687 A | 10/2000 | Shirai et al. | 361/749 |
| 6,166,915 A | 12/2000 | Lake et al. | 361/748 |
| 6,197,425 B1 | 3/2001 | Sckimoto et al. | 428/416 |
| 6,200,451 B1 | 3/2001 | Redline et al. | 205/85 |
| 6,252,550 B1 | 6/2001 | Vernon | 343/700 |
| 6,259,369 B1 | 7/2001 | Monico | 340/572.8 |
| 6,265,977 B1 | 7/2001 | Vega et al. | 340/572.7 |
| 6,299,749 B1 | 10/2001 | Schnayderman | 205/118 |
| 6,308,406 B1 | 10/2001 | Gill et al. | 29/849 |
| 6,342,266 B1 | 1/2002 | Forsten et al. | 427/96 |
| 6,356,234 B1 | 3/2002 | Harrison et al. | 343/700 |
| 6,404,339 B1 | 6/2002 | Eberhardt | 340/572.1 |
| 6,407,706 B2 | 6/2002 | Vernon | 343/700 |

OTHER PUBLICATIONS

Gilleo. "Chapter I: The History of the Printed Circuit ," *Printed Circuit Fabrication*, vol. 22, No. 1, Jan. 1999, pp. 18–21.

Web pages from <<www.rtcircuits.com>> (visited May 1, 2001).

Evans et al. "Lithographic Film Circuits—A Review" 27:3 Circuit World 31–34 (2001).

000
CIRCUIT ELEMENTS HAVING AN EMBEDDED CONDUCTIVE TRACE AND METHODS OF MANUFACTURE

RELATED APPLICATIONS

This application claims the benefit of and priority to copending U.S. Provisional Patent Application Ser. No. 60/280,952, filed Apr. 2, 2001, and copending U.S. Provisional Patent Application Ser. No. 60/292,401, filed May 21, 2001, both entitled "Circuit Board Layer Having an Embedded Conductive Trace and Method of Manufacture," the entire disclosures of which are hereby incorporated by reference herein.

FIELD OF THE INVENTION

The present invention relates generally to circuit elements, and more specifically, to methods and apparatus for forming a circuit element including one or more conductive traces at least partially embedded in a thermoplastic substrate.

BACKGROUND OF THE INVENTION

Conductive traces typically are applied to a substrate, such as a silica wafer, using photolithography techniques that require many steps, including application of resist, masking and etching. These steps often use chemicals that are environmentally unfriendly. Conductive traces printed on substrates using printing presses typically are unstable and detach from the substrate when exposed to further processing, e.g., plating baths and solder reflow. The conductive traces also are typically not capable of being electroplated as they lack sufficient conductivity and first must be electrolessly plated, which is expensive as it requires two plating steps and is environmentally unfriendly. There exists a need for circuit elements and methods of manufacture that permit printing of conductive traces using printing presses, where the conductive traces are stable, e.g., capable of being electrolytically plated. The present invention addresses these needs and provides additional benefits and improvements.

SUMMARY OF THE INVENTION

A novel approach to the manufacture of circuit elements has now been discovered. By practicing the disclosed invention, the skilled practitioner can construct novel circuit elements having embedded conductive traces. The advantages of the present invention include stable and well-adhered conductive traces that can be printed using commercial printing presses and can withstand further use and processing such as plating and solder reflow.

In one aspect, the invention features a circuit element that includes a thermoplastic substrate, and a conductive trace at least partially embedded in the thermoplastic substrate. The thermoplastic substrate can be formed from thermoplastic polymers which include ethylene vinyl acetate, ethylene ethyl acetate, polyethylene, polypropylene, polycarbonate, polyimide, polyethylene naphthalate, polyphenylene sulfide, polyester, synthetic paper, polystyrene, and copolymers and combinations thereof.

The circuit element can further include a second substrate, wherein the second substrate is disposed adjacent to the thermoplastic substrate and opposite the conductive trace. The thermoplastic substrate can be hot melt coated, co-extruded or laminated onto the second substrate. The second substrate can be a second thermoplastic substrate having a second softening temperature that is higher than the softening temperature of the thermoplastic substrate. For example, the thermoplastic substrate can be formed from ethylene vinyl acetate, ethylene ethyl acetate, polyethylene, polypropylene, polycarbonate, copolymers or combinations thereof, and the second substrate can be formed from polyimide, polyethylene naphthalate, polyphenylene sulfide, polyester, synthetic paper, polystyrene, or copolymers thereof. The second substrate also can be formed from metal, metal foils, paper, glass, silica, and combinations thereof.

The circuit element can further include a third substrate disposed adjacent to the second substrate opposite the thermoplastic substrate. The third substrate can be a thermoplastic substrate. Optionally, a conductive trace can be at least partially embedded in the third thermoplastic substrate.

The conductive trace can include conductive particles having a particle size distribution having at least two modes. The conductive particles can include both conductive powder and conductive flakes. The conductive flakes typically have a mean aspect ratio between about 2 and about 50. The conductive trace can include conjugated conductive particles. The circuit element can include electrolytic conductive plating disposed on the conductive trace and/or a protective coating disposed on a surface of the circuit element.

In another aspect, the invention features a method of forming a circuit element. The method includes the steps of providing a thermoplastic substrate having a softening temperature ($T_S$), printing a conductive ink onto the thermoplastic substrate to form a trace, and embedding the trace into the thermoplastic substrate by heating the thermoplastic substrate to a temperature above about the $T_S$ about the trace.

The method can include drying the conductive ink at a temperature less than about the $T_S$ to form a trace prior to embedding it into the thermoplastic substrate. The method also can include using a thermoplastic substrate that also includes one or more additional substrates disposed adjacent to the thermoplastic substrate. The method can include pre-heating the thermoplastic substrate to a temperature above about the $T_S$, and allowing the thermoplastic substrate to cool to below about the $T_S$, prior to printing the conductive ink onto the thermoplastic substrate.

The step of embedding the conductive trace into the thermoplastic substrate can be achieved by localized heating. For example, the conductive trace can be embedded into the thermoplastic substrate by induction heating the conductive material in the conductive ink.

The method also can include flashing off at least a portion of a vehicle of the conductive trace and/or conjugating at least a portion of a conductive material in the conductive trace.

The method can include cross-linking the thermoplastic substrate after embedding the conductive trace in the thermoplastic substrate. The thermoplastic substrate can be cross-linked by electron beam radiation. The method also can include printing solder onto the thermoplastic substrate, adding electrical components to the thermoplastic substrate, and heating the solder to a reflow temperature. The method can include electrolytically plating the conductive trace to form electrolytic conductive plating on the conductive trace and/or coating a surface of the circuit element with a protective coating.

DESCRIPTION OF THE DRAWINGS

The invention is pointed out with particularity in the appended claims. The drawings are not necessarily to scale, emphasis instead generally being placed upon illustrating the principles of the invention. The advantages of the invention can be better understood by reference to the description taken in conjunction with the accompanying drawings, in which:

Like reference characters in the respective drawn figures indicate corresponding parts.

DETAILED DESCRIPTION OF THE INVENTION

Disclosed herein are circuit elements that include at least one conductive trace and methods of their manufacture. One aspect of the present invention is directed to a circuit element including a thermoplastic substrate and a conductive trace at least partially embedded in the thermoplastic substrate.

A thermoplastic substrate is a substrate that becomes plastic, i.e., it becomes viscous or flows, when exposed to thermal energy. The softening temperature (Ts) of a thermoplastic layer is the temperature at which the thermoplastic substrate becomes plastic or softens. The softening temperature often can be qualitatively determined by routine optical inspection of the thermoplastic substrate at different temperatures. For some thermoplastic substrates, the softening temperature is the temperature at which the thermoplastic substrate changes from an opaque or cloudy layer to a translucent layer. An alternative method of determining softening temperature is to dispose a plurality of thermoplastic substrates adjacent to paper layers and send each through a laminator set at increasingly higher temperatures. At about the softening temperature, the thermoplastic substrate will adhere to the paper.

Figure 1:
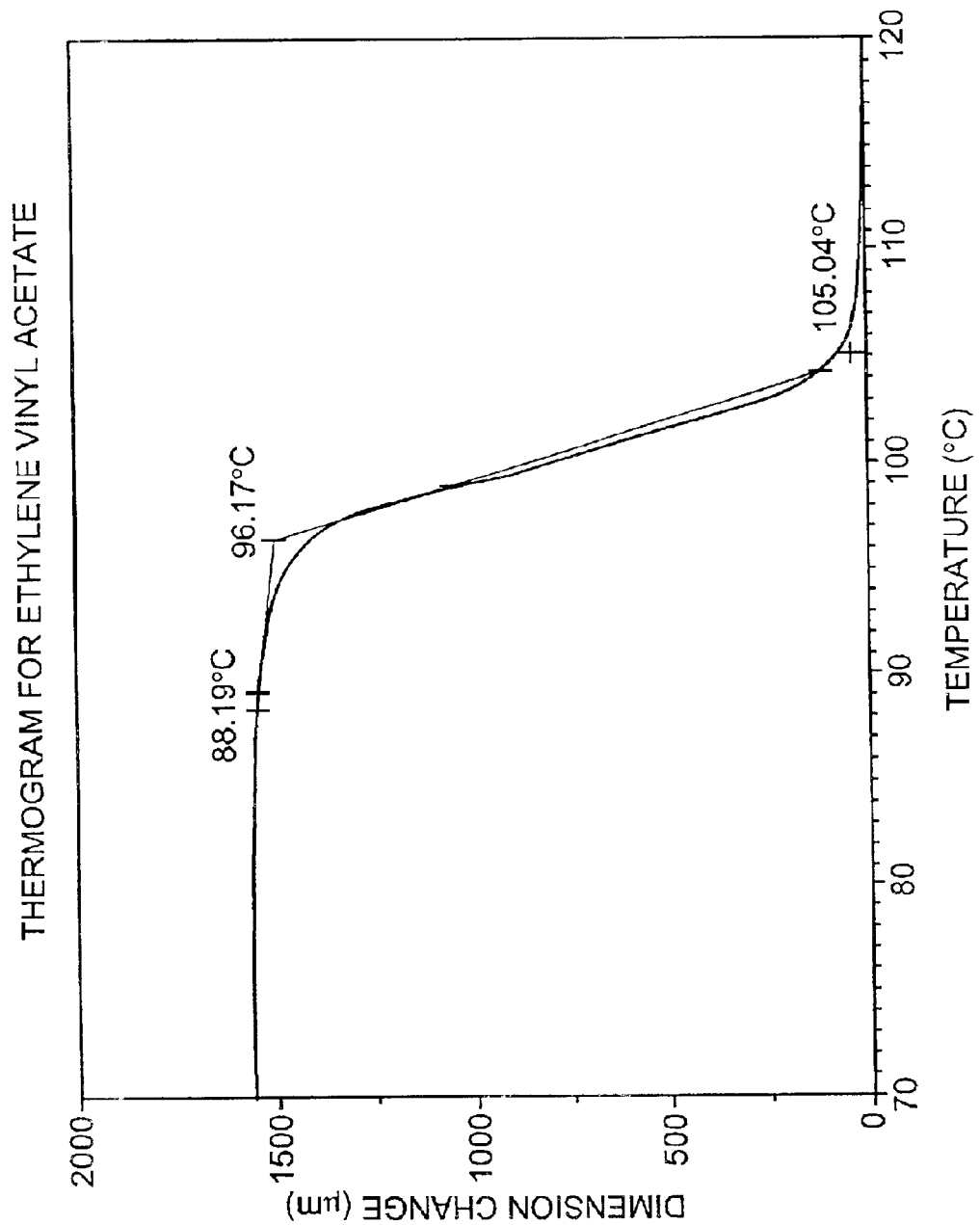
FIGS. 1 and 2 are graphical representations of dimension change versus temperature for ethylene vinyl acetate and ethylene ethyl acetate, respectively.
Figure 2:
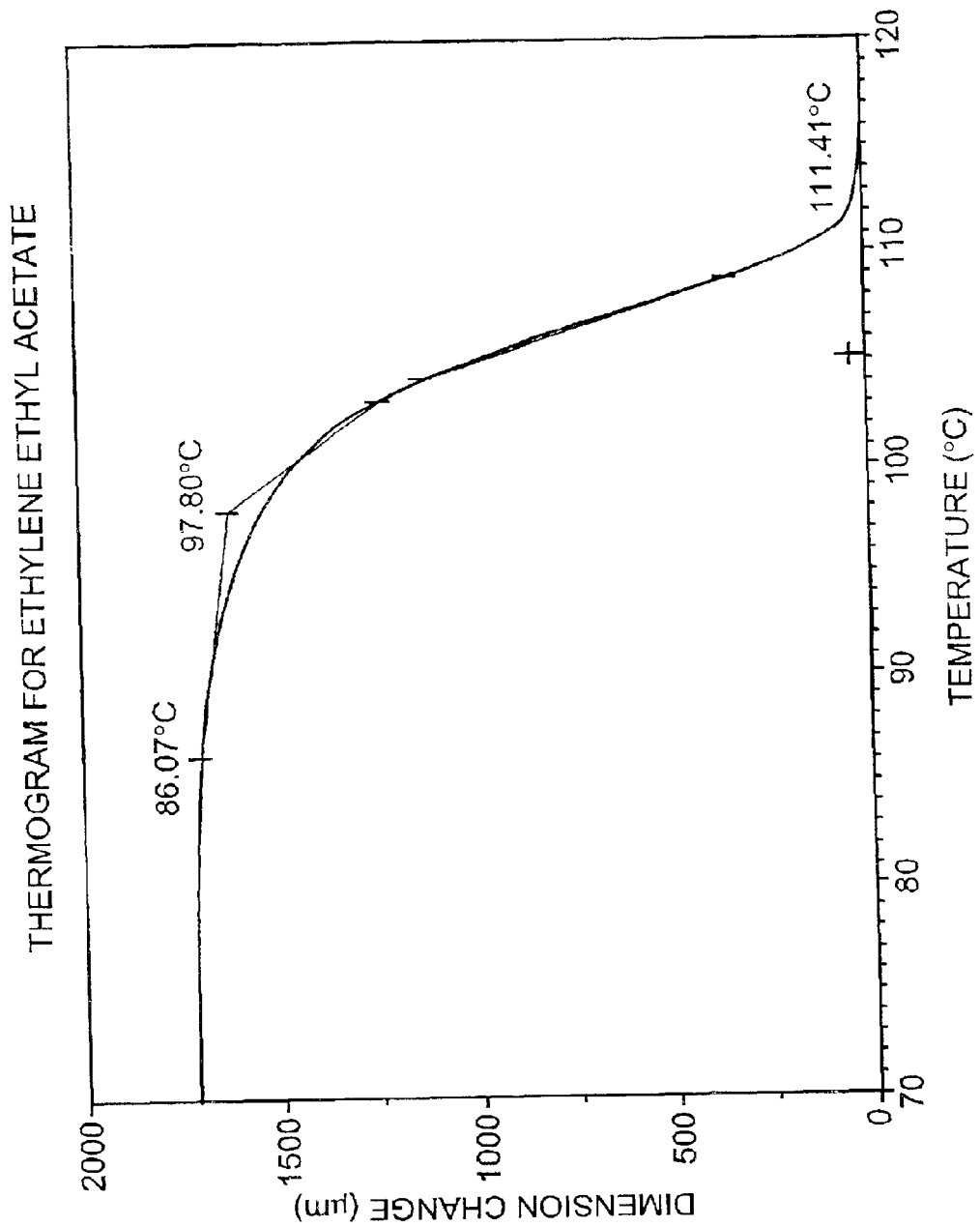

Another way to determine softening temperature is to run a softening point test or thermogram for the thermoplastic polymer. A thermogram is a thermomechanical analysis of a substance that measures the deformation or dimension change of the substance as a function of temperature in a controlled atmosphere. The point at which the dimension change precipitously drops is the softening temperature. Examples of the results of such a test run on a Dupont MTA Thermomechanical (TMA) Analyzer by Chemir/Polytech Laboratories, Inc. (Maryland Heights, Mo.), are depicted in FIGS. 1 and 2. FIGS. 1 and 2 are graphical representations of dimension change versus temperature for ethylene vinyl acetate and ethylene ethyl acetate, respectively, from about 25° C. to about 150° C. where the temperature was increased 5° C. per minute. FIGS. 1 and 2 show the dimension change in micrometers from 70° C. to 120° C. FIG. 1 shows that the ethylene vinyl acetate began to deform at about 88° C., was substantially melted at about 105° C., and has a softening temperature of about 96° C. FIG. 2 shows that the ethylene ethyl acetate began to deform at about 86° C., was substantially melted at about 111° C., and has a softening temperature of about 98° C.

A conductive trace is any conductive path. Conductive traces include, but are not limited to, circuit board traces, touch pad elements, RFID tags, and printed resistors and capacitors. The conductive traces of the present invention can be conductive enough to carry current or they can be sufficiently conductive to carry or transmit a signal, such as for use as a touch pad element. The conductive traces of the present invention can be sufficiently conductive to facilitate electrolytic plating, if additional conductivity is desired.

The conductive traces are embedded in the thermoplastic layer such that they interrupt or breach the surface of the thermoplastic layer versus merely being disposed on the surface of the thermoplastic layer. Thus, the conductive traces become an integral part of the circuit element. When the terms "embedded" or "embedding" are used, these terms mean "at least partially embedded" or "at least partially embedding," respectively, if not otherwise indicated. This is accomplished at least in part by heating the thermoplastic layer to above about its softening temperature at least around the trace. The thermoplastic layer can be heated locally, e.g., with induction heating. Alternatively, the thermoplastic substrate can be heated globally, e.g., with an oven.

Figure 3A:
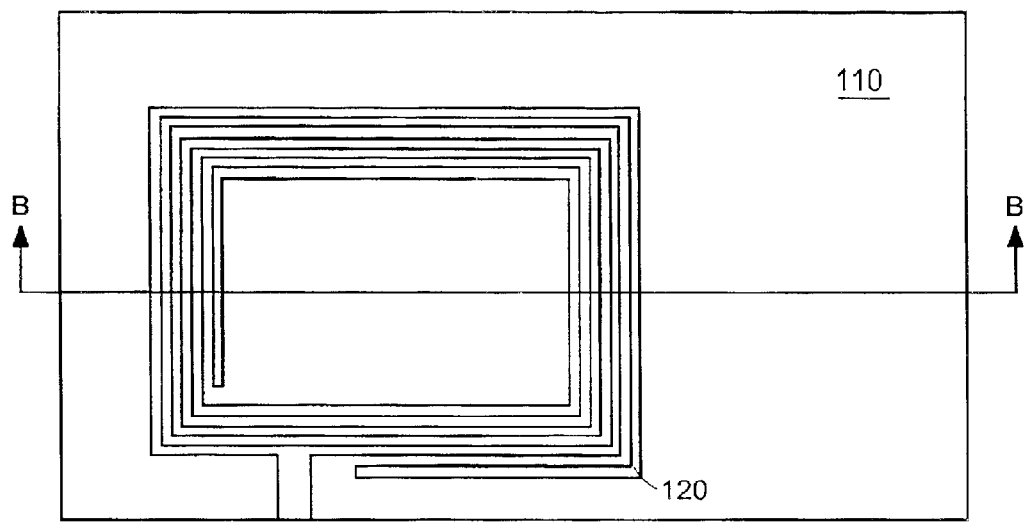
FIGS. 3A and 3B are a plan view and a cross-sectional side view taken along line B—B, respectively, of an exemplary circuit element formed in accordance with the present invention.
Figure 3B:
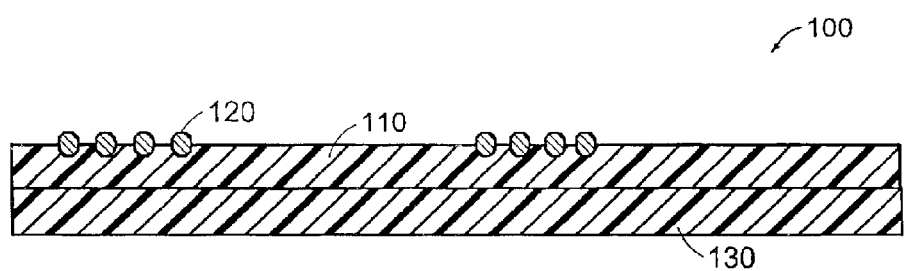

FIGS. 3A and 3B are a plan view and a cross-sectional side view taken along line B—B, respectively, of an exemplary circuit element formed in accordance with the present invention. In general overview, the circuit element 100 includes a thermoplastic substrate 110, a second substrate 130, and a conductive trace 120 at least partially embedded in the thermoplastic substrate 110. In FIGS. 3A and 3B, an RFID tag is depicted, however, any conductive trace design can printed.

The thermoplastic substrate, the second substrate and any additional substrates (collectively the "substrate layers"), can include any substrate layer that can be used to construct a circuit element. The substrate layers can be provided as individual sheets so that they can be used in a sheet fed process, or as continuous sheets so that they can be processed in a reel to reel or roll to roll process. The substrate layers also can be provided as individual sheets adhered to a continuous film, e.g., by adhesion, co-extrusion or lamination, for processing in a continuous fashion in a commercial printer. The substrate layers can be of any thickness. Preferably, the substrate layers are together thin and flexible enough to be printed in a commercial printer and otherwise processed in a continuous fashion.

The substrate layers can be affixed together by various methods known in the art, including, but not limited to, use of adhesives, coating including bar coating and hot melt coating, hot melt extrusion, laminating including heat laminating, and co-extrusion. In a preferred embodiment, the substrate layers are co-extruded. Further substrate layers can include additional thermoplastic substrate layers that also can include conductive traces partially embedded therein, e.g., to provide a double-sided circuit board. Further substrate layers additionally or alternatively can include internal layers, e.g., dielectric layers such as conventional silica wafers, coated, printed, or laminated on both sides with a conductive material to provide desired mechanical or electrical properties. The substrate layers and/or multiple circuit elements of the present invention can be combined, e.g., to form a multi-layer circuit board. The substrate layers can include a composite such as glass fiber or paper impregnated with epoxy resins. The substrate layers also can include other additives, e.g., to improve fire retardancy, mechanical strength, thermal strength, and/or dielectric properties.

The thermoplastic substrate can be formed from any thermoplastic including, but not limited to, polyester, polyimide, polyethylene naphthalate, polyphenylene sulfide, synthetic papers, polyethylene, polypropylene, polycarbonate, ethylene vinyl acetate, ethylene ethyl acetate, and copolymers and combinations of these polymers. The thermoplastic substrate can include other materials to increase mechanical strength, to adjust dielectric properties, and/or to render the substrate flame retardant. The substrate layers readily can be chosen by the skilled practitioner depending on the properties desired for the circuit element. For example, if it is desired to construct a circuit element requiring flexibility, tear resistance, and high temperature stability, a second substrate formed from polyimide or polyethylene naphthalate can be employed that is coated with a thermoplastic substrate having a lower $T_S$. If it is desired to create a moisture barrier, a second substrate that is a metal or a metal foil can be employed.

A preferred thermoplastic polymer is ethylene vinyl acetate. Another preferred thermoplastic polymer is ethylene ethyl acetate. Suitable two-layer substrates include polyester substrates hot melt coated with ethylene vinyl acetate manufactured by General Binding Corporation (Skoke, Ill.), and commercially available from McIntire Business Products (Concord, N.H.). For example, the 5 mil product that includes a 3 mil polyester layer hot melt coated with a 2 mil ethylene vinyl acetate layer, and the 3 mil product that includes a 1 mil polyester layer hot melt coated with a 2 mil ethylene vinyl acetate layer, are suitable for use in accordance with the present invention. Suitable polyethylene naphthalate layers are available under the mark Kaladex® by I.E. du Pont de Nemours and Company (Circleville, Ohio). Suitable polyimide layers are available under the mark Kapton® by I.E. du Pont de Nemours and Company (Circleville, Ohio).

Synthetic papers are papers that include thermoplastic polymers that are ground or made into fibers and processed in a paper machine. Suitable synthetic papers for use in accordance with the circuit element and methods of the present invention include, but are not limited to, POLYART® clay coated polyethylene synthetic paper from Arjobex North America (Charlotte, N.C.), and TESLIN® silica and polyethylene synthetic printing sheets from PPG (Vernon Hills, Ill.).

If the second substrate also is a thermoplastic, preferably the second substrate is formed from a thermoplastic having a higher softening temperature than that of the thermoplastic substrate. Thus, the thermoplastic substrate can be heated to above about its softening temperature to embed the conductive trace without reaching the higher softening temperature of the second substrate. For example, if the thermoplastic substrate is formed from an ethylene vinyl acetate, an ethylene ethyl acetate, a polyethylene, a polypropylene, a polycarbonate, or a copolymer or combination thereof, preferably the second substrate is formed from a thermoplastic having a higher softening temperature. Examples of such second substrates can include substrates formed from polyimide, polyethylene naphthalate, polyphenylene sulfide, polyester, synthetic paper, polystyrene, and copolymers and combinations thereof. Second substrates also can include metal, metal foils, paper, glass, silica, and combinations thereof.

The conductive trace is formed from conductive ink that is printed on and partially embedded into the thermoplastic substrate. The conductive ink includes conductive materials and can be formulated for printing onto the thermoplastic substrate using various printing processes. The conductive ink typically includes a vehicle including one or more resins and/or solvents. Various other ink additives known in the art, e.g., antioxidants, leveling agents, flow agents and drying agents, may be included in the conductive ink. The conductive ink can be in the form of a paste, slurry or dispersion. The ink generally also includes one or more solvents that readily can be adjusted by the skilled practitioner for a desired rheology. The ink formulation preferably is mixed in a grinding mill to sufficiently wet the conductive particles with the vehicle, e.g., solvent and resin.

The conductive material can include silver, copper, gold, palladium, platinum, carbon, or combinations of these particles. The average particle size of the conductive material preferably is within the range of between about 0.5 $\mu$m and about 20 $\mu$m. More preferably the average particle size is between about 2 $\mu$m and about 5 $\mu$m. Even more preferably, the average particle size is about 3 $\mu$m. The amount of conductive material in the conductive trace preferably is between about 60% and about 90% on a dry weight basis. More preferably, the amount of conductive material in the conductive trace is between about 75% and about 85% on a dry weight basis.

Optionally, the conductivity of the trace can be increased if the conductive trace includes a particle size distribution of conductive particles that does not have a Gaussian or normal distribution but a particle size distribution having at least two modes, e.g., bimodal and trimodal distributions. For example, a bimodal distribution of particles can increase the conductivity of the conductive trace because the smaller particles can fill in gaps between the larger particles and thereby decrease the distances over which electrons must travel between particles.

A bimodal distribution can be obtained, e.g., by mixing two particle mixtures, each having different mean particle sizes. One suitable conductive ink includes a mixture of two types of silver particles, each having different particles size distributions. The first is available under the trade designation RA15 from Mettalor (Attleboro, Mass.), and has particles, 10% of which are equal to or less than 2.6 $\mu$m in size, 50% of which are equal to or less than 7.3 $\mu$m in size, and 90% of which are equal to or less than 16.3 $\mu$m in size. The second is available under the trade designation RA76 from Mettalor (Attleboro, Mass.), and has particles, 10% of which are equal to or less than 2.5 $\mu$m in size, 50% of which are equal to or less than 10.1 $\mu$m in size, 90% of which are equal to or less than 22.9 $\mu$m in size, and 100% of which are equal or less than 62.2 $\mu$m in size. Of course, the particle size distribution can be trimodal and so on.

The conductive particles can be flakes and/or powders. Preferably, the conductive flakes have a mean aspect ratio of between about 2 and about 50, and more preferably between about 5 and about 15. An aspect ratio is a ratio of the largest linear dimension of a particle to the smallest linear dimension of the particle. For example, the aspect ratio of an ellipsoidal particle is the diameter along its major axis divided by the diameter along its minor axis. For a flake, the aspect ratio is the longest dimension across the length of the flake divided by its thickness.

Suitable conductive flakes include those sold by Metalor (Attleboro, Mass.), under the following trade designations: P185-2 flakes having a particle size distribution substantially between about 2 µm and about 18 µm; P264-1 and P264-2 flakes having particle size distributions substantially between about 0.5 µm and about 5 µm; P204-2 flakes having a particle size distribution substantially between about 1 µm and about 10 µm; P204-3 flakes having a particle size distribution substantially between about 1 µm and about 8 µm; P204-4 flakes having a particle size distribution substantially between about 2 µm and about 9 µm; EA-2388 flakes having a particle size distribution substantially between about 1 µm and about 9 µm; SA-0201 flakes having a particle size distribution substantially between about 0.5 µm and about 22 µm and having a mean value of about 2.8 µm; RA-0001 flakes having a particle size distribution substantially between about 1 µm and about 6 µm; RA-0015 flakes having a particle size distribution substantially between about 2 µm and about 17 µm; and RA-0076 flakes having a particle size distribution substantially between about 2 µm and about 62 µm, and having a mean value of about 12 µm. Suitable silver powders include those sold by Metalor (Attleboro, Mass.), under the following trade designations: C-0083P powder having a particle size distribution substantially between about 0.4 µm and about 4 µm, and having a mean value of about 1.2 µm; K-0082P powder having a particle size distribution substantially between about 0.4 µm and about 6.5 µm, and having a mean value of about 1.7 µm; and K-1321P powder having a particle size distribution substantially between about 1 µm and about 4 µm.

The resin in the conductive ink can include any resin including, but not limited to, polymers, polymer blends, and fatty acids. Alkyd resins can be used, including LV-2190, LV-2183 and XV-1578 alkyd resins from Lawter International (Kenosha, Wis.). Also suitable are Crystal Gloss Metallic Amber resin, Z-kyd resin, and alkali refined linseed oil resin available from Kerley Ink (Broadview, Ill.). Soy resins available from Ron Ink Company (Rochester, N.Y.), also are suitable.

Solvents for use in the conductive ink formulation are well known in the art and a skilled practitioner readily can identify a number of suitable solvents for use in a particular printing application. Solvents generally will comprise between about 3% and about 40% of the ink by weight on a wet basis. The amount will vary depending on various factors including the viscosity of the resin, the solvation characteristics of the solvent, and the conductive particle size, distribution and surface morphology for any given printing method. Generally, solvent can be added to the ink mixture until a desired ink rheology is achieved. The desired rheology depends on the printing method used, and are known by skilled printers and ink manufacturers. The solvent in the conductive ink can include non-polar solvents such as a hydrocarbon solvent, water, an alcohol such as isopropyl alcohol, and combinations thereof. Preferably, an aliphatic hydrocarbon solvent is employed. Examples of suitable solvents include Isopar H aliphatic hydrocarbon solvent from Exxon (Houston, Tex.); EXX-PRINT® M71a and EXX-PRINT® 274a aliphatic and aromatic hydrocarbon solvent from Exxon Corporation (Houston, Tex.); and McGee Sol 52, McGee Sol 47 and McGee Sol 470 aliphatic and aromatic hydrocarbon solvent from Lawter International (Kenosha, Wis.).

The conductive traces formed in accordance with the present invention can be formed at high resolutions and in intricate patterns. Printing presses have been used to print conductive traces that are capable of line widths and gaps of about 100 µm. It is envisioned that more intricate designs and smaller line widths can be achieved in accordance with the present invention depending on the printing equipment. The conductive trace can form or be part of an RFID tag, a printed wiring board, a printed circuit board, single layer or multi-layer, a passive component such as a resistor or capacitor, a touch pad, or the like. Numerous other applications, such as microwave antennas are contemplated by the present invention. The conductivity can be adjusted for various application, e.g., to tune an antenna, or to form a resistor or capacitor.

Figure 4A:
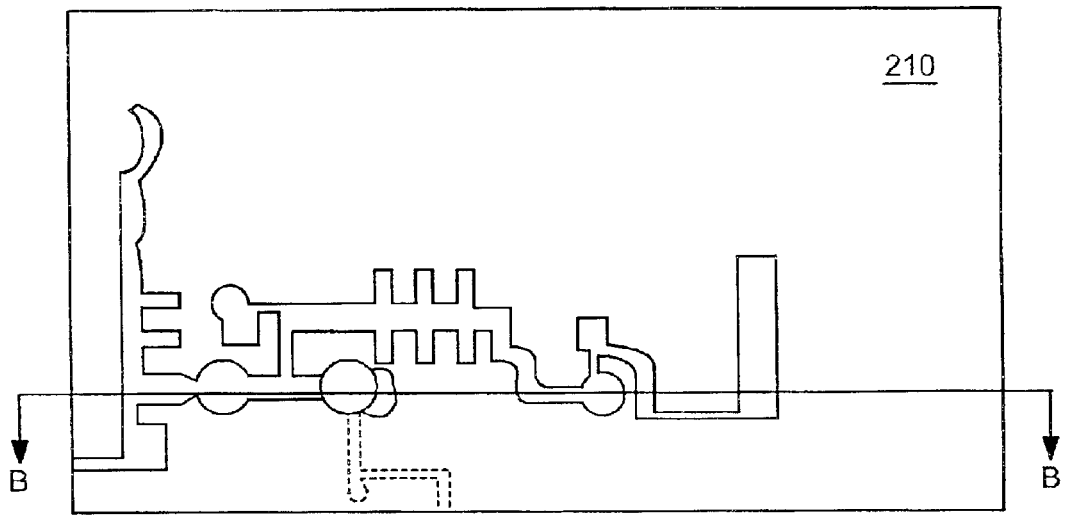
FIGS. 4A and 4B are a plan view and a cross-sectional side view taken along line B—B, respectively, of another exemplary circuit element formed in accordance with the present invention.
Figure 4B:
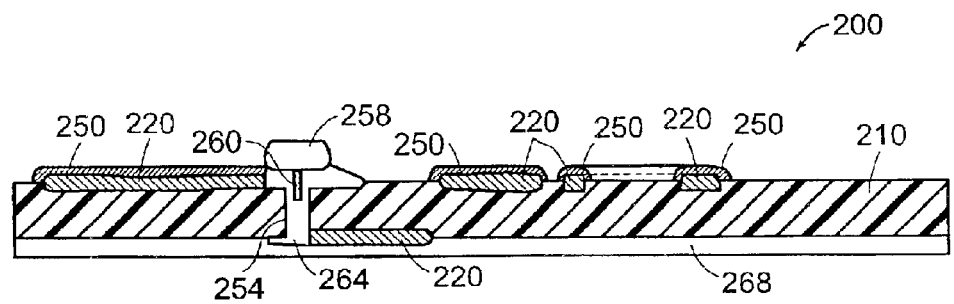

FIGS. 4A and 4B are a plan view and a cross-sectional side view, respectively, of another exemplary circuit element 200 formed in accordance with the present invention. In general overview, the circuit element 200 includes a thermoplastic substrate 210, a conductive trace 220 embedded in the substrate 210, and a conductive plating 250. The circuit element 200 also includes a via 254, defined by the substrate 210, surface mounted device 258 having a contact pin 260. The via is filled with a solder 264, and the circuit element is coated with a protective coating 268.

The substrate can include one layer as shown, or a plurality of layers. For example, the substrate can include three layers, e.g., a polyester layer coated on each side with a thermoplastic polymer such as ethylene ethyl acetate or ethylene vinyl acetate.

Electrolytic plating also is called electrolytic conductive plating or electroplating, which means the electrolytic deposition or electrodeposition of a conductive material from a plating solution by the application of electric current. Conductive plating is formed from a conductive plating material. Suitable conductive plating materials include, but are not limited to, copper, nickel, gold, silver, palladium, and combinations of thereof. The conductive plating is preferably formed by electrolytically plating the partially embedded conductive traces. Methods of electrolytic plating are known in the art. Preferably the conductive material in the conductive traces are silver particles and the conductive traces are electroplated with copper. Additionally, other types of plating can be used, e.g., electrochemical or electroless plating.

The circuit element can be coated or plated with a protective coating formed from a polymer or metal, e.g., nickel, to protect the conductive traces, the conductive plating and/or other elements of the circuit element from corrosion or other damage. Suitable protective coating materials and methods of coating or plating are known in the art. Additionally or alternatively, both sides of the substrate can be coated with further protective coatings. Such coatings can be present only on the conductive traces or on predetermined sections of the circuit element.

Surface mounted devices can be incorporated into the circuit elements of the present invention. Such devices can be attached to the substrate layers by a pin, which can be affixed with solder, an electrically conductive adhesive, or the like. Solder or an electrically conductive adhesive and one or more vias also can facilitate electrical communication between devices and traces on both sides of the substrate. Additionally or alternatively, solder pads without vias can attach other surface mounted devices, and vias can be used to facilitate registration or communication between one or several substrates. Substrates can be stacked and even laminated to provide a multi-layer circuit board with surface mounted devices only on the outer layers.

Another aspect of the present invention is a method of forming a circuit element. The method generally includes the steps of providing a thermoplastic substrate having a softening temperature ($T_S$); printing a conductive ink onto the thermoplastic substrate to form a trace; and embedding the trace into the thermoplastic substrate by heating the thermoplastic substrate to a temperature above about $T_S$ about the trace.

Figure 5:
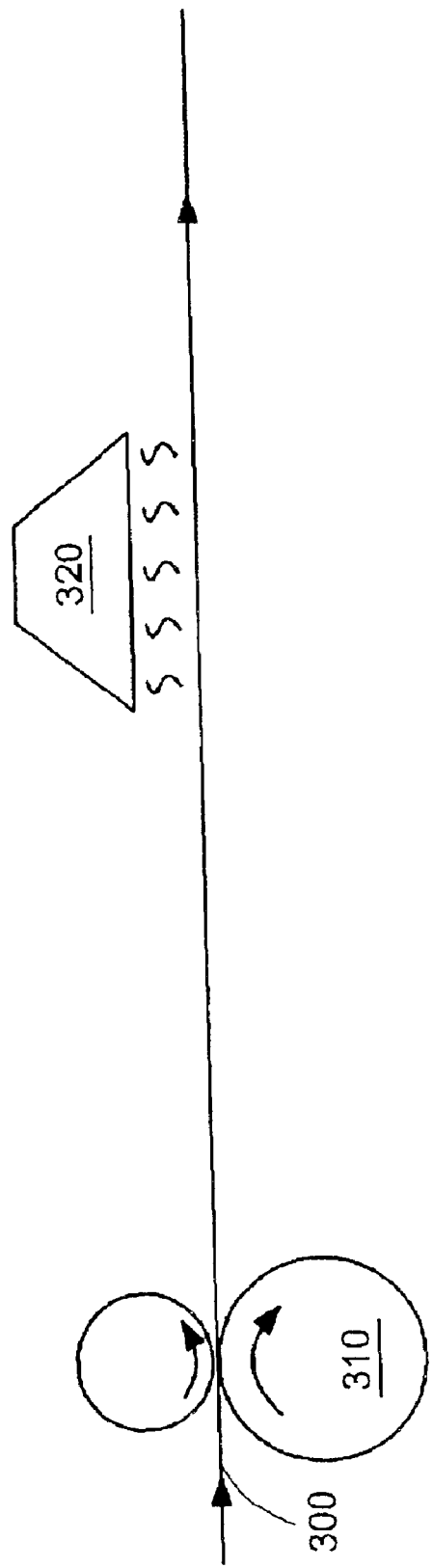
FIG. 5 is a schematic representation of an exemplary method of forming a circuit element of the present invention.

FIG. 5 is a schematic representation of an exemplary method of forming a circuit element of the present invention. The method generally includes providing a thermoplastic substrate 300 having a softening temperature, printing a conductive ink onto the thermoplastic substrate using printer 310 to form one or more traces, and embedding the trace into the thermoplastic substrate by heating the substrate with heating device 320 to a temperature at or above the softening temperature about the trace.

The thermoplastic substrate is as described above and can include additional substrate layers. For example, it can include a second substrate disposed adjacent to the thermoplastic substrate. The second layer can be polymeric or non-polymeric, such as silica. The layers can be affixed to each other using various techniques known in the art, such as hot melt coating, lamination, coextrusion, bar coating, or adhesion. Preferably, the thermoplastic substrate is formed from ethylene vinyl acetate or ethylene ethyl acetate, and it is coextruded or hot melt coated to a second substrate formed from polyester. Hot melt coating refers to extruding a molten polymer layer onto a moving substrate. Alternative methods of coating include curtain coating and bar coating. The substrate layers preferably are in web form so that they easily can be stored and shipped before and/or after they are incorporated into the circuit elements of the present invention, and so that they can readily be fed through a continuous process, e.g., a roll to roll process or a sheet fed process.

The conductive ink can be applied to the thermoplastic substrate using printing techniques known in the art for printing inks on paper and other substrates, including, but not limited to, offset-lithographic (wet, waterless and dry), flexographic, rotogravure (direct or offset), intaglio, ink jet, electrophotographic (laser jet and photocopy), and letterpress printing. These printing methods are desirable because conventional methods for forming traces on circuit boards include multiple steps, e.g., photoresist, cure and etching, are time intensive, environmentally unfriendly, and relatively expensive. Commercial printing presses preferably are used for printing on the substrates of the present invention. Commercial printing presses may require additional drying capability to dry the ink after printing or require modifications to handle polymer films, e.g., to handle electrostatic charge. These types of modifications are known in the art and typically can be ordered when purchasing a commercial printing press. Depending on the printing technology, printing speed in the range of from about 150 feet per minute to about 300 feet per minute readily can be achieved. It is envisioned that even greater printing speeds can be achieved, e.g., about 1000 feet per minute or more. It also is envisioned that personal printers, e.g., ink jet and laser jet printers, can be used to print conductive traces on substrates in accordance with the present invention.

The ink preferably is deposited in a quantity such that the dried conductive trace is from about 1 $\mu$m to about 8 $\mu$m thick depending on the printing process used. A single impression giving an ink film thickness of about 2 $\mu$m to about 3 $\mu$m typically is sufficient to achieve sufficient conductivity for plating. The conductive ink optionally can be printed on the thermoplastic substrate two or more times to deliver more conductive ink to the thermoplastic substrate. Preferably, however, the conductive ink is printed only once because there can be registration problems when printing multiple times. Conductive inks are commercially available and also can be readily made as known in the art and described herein.

Optionally, the conductive ink can be dried at a temperature less than about the $T_S$ to form a conductive trace prior to the step of embedding the trace into the thermoplastic substrate. The conductive ink is dried at a temperature less than about the $T_S$ to drive off some or all of the solvent or carrier in order to minimize any bubbles containing trapped solvent, and/or pin holes or craters from rapid solvent evaporation. The conductive ink can be dried using an oven, such as a convection oven, or using infrared, and radio frequency drying. Preferably, the heating device is designed to allow the printed substrate to pass therethrough so that the conductive ink can be dried in a continuous manner to facilitate large-scale production. The drying temperature employed depends on the ink used, the softening temperature of the thermoplastic substrate, and the drying time or belt speed. Typical drying temperatures are from about 125° F. to about 150° F. After the drying step, the circuit element can be allowed to cool prior to the embedding step. Alternatively, the drying step can be achieved continuously with the embedding step described below as the trace is heated to the softening temperature.

With or without a separate drying step, the trace is partially embedded into the thermoplastic substrate by heating the thermoplastic substrate to a temperature above or about equal to the $T_S$ about the trace. Around and above the $T_S$ of the thermoplastic substrate, the thermoplastic substrate softens and the conductive trace becomes partially embedded in the thermoplastic substrate. All or portions of the thermoplastic substrate can be heated in an oven, such as a convection oven. The thermoplastic substrate also can be heated locally about the conductive traces by induction heating of the conductive material in the conductive traces, e.g., by exposure to microwave energy. Additional or alternative methods of heating include infrared, microwave, and radio frequency heating. Generally, the higher the temperature, more of the trace will become embedded in the thermoplastic substrate. However, if the temperature is too high, the thermoplastic substrate and any other substrate layers can be compromised. Typical embedding temperatures range from about 125° F. to about 300° F., depending on the substrate, but can be in excess of about 500° F. Preferably, the oven or other method of heating the polymer is designed to allow the printed thermoplastic substrate to pass therethrough so that the conductive trace can be embedded in a continuous manner to facilitate large scale production.

The embedded conductive trace provides improved bonding or adhesion to the circuit element and is resistant to the rigorous conditions of further use and processing, such as, e.g., electrolytic plating. The adhesion of a conductive trace and/or any plating thereon can be determined by a standard tape test where Scotch® adhesive tape is applied to the circuit element, peeled off, and optically inspected for transfer of the conductive trace or plating from the circuit element to the Scotch® adhesive tape. The tape exerts a peel force on the conductive trace and/or any plating thereon of approximately 6 lb/in (1050 N/m). An adhesion of about 5 to about 7 pounds per square inch generally is considered acceptable for most uses of circuit elements, and such adhesion has been achieved by the circuit elements of the present invention.

The embedded conductive trace typically is more conductive than conductive traces that have not been embedded, but only dried on the thermoplastic substrate. For example, the resistance of conductive traces disposed on a ethylene vinyl acetate thermoplastic substrate, has been observed to decrease by about 50% when comparing the resistance of conductive traces before and after the embedding step. Without wishing to be bound by any particular theory, it is believed that the conductive trace is less resistant, at least in part, because the application of heat creates a soft weld between at least some of the conductive particles in the trace. Consequently, at least some of the conductive particles are in substantially direct physical contact, no longer separated by the resin, which typically is not conductive. It has been observed that the higher the temperature experienced in during embedding, the better the conductivity of the conductive trace. Additionally, it is believed that the embedding step increases the conductivity of the conductive trace because it decreases the distance between any conductive particles that are not in physical contact, so that electrical current has a shorter distance to traverse between particles. In addition, to facilitate the partial embedding of the conductive trace into the thermoplastic substrate, the embedding step also can involve the application of pressure to the circuit element. The application of pressure can improve the adhesion or bonding of the conductive trace to the thermoplastic substrate.

Another embodiment of the present invention contemplates the embedding the conductive trace in the thermoplastic substrate at a temperature about equal to or in excess of a temperature needed to flash off at least a portion of the vehicle, e.g., resin and solvent, in the conductive trace. Preferably, at least a portion of the conductive material in the conductive trace is "conjugated" in the sense that the conductive particles act or operate as if joined. Without wishing to be bound to any particular theory, it is believed that exposure to a temperature equal to or in excess of a temperature needed to flash off at least a portion of the vehicle initiates or promotes electron sharing between at least some of the conductive particles such that electrons readily can flow between particles rather than having to traverse a non-conductive vehicle, such as resin. A temperature of above about 500° F. generally is sufficient to promote conjugation between silver particles and flash off at least a portion of the vehicle. Conductive traces embedded according to this method generally exhibit higher conductivity that conductive traces embedded at lower temperatures.

In this embodiment, a thermoplastic substrate should be chosen that can withstand the temperatures required to flash off at least a portion of the vehicle, without substantial damage, such as warping, melting, or burning to the thermoplastic substrate. In order to avoid such damage, the thermoplastic substrate can be constructed from polymers having softening temperatures in the range of the flashing temperature. Examples of such polymers include polyimides, polyethylene naphthalates (PEN), polystyrenes, polyesters, synthetic papers, polyphenylene sulfides (PPS), and copolymers and combinations thereof.

The thermoplastic substrate can be heated using any conventional method such as an oven or furnace. Preferably, however, the thermoplastic substrate is heated locally about the traces by induction heating a conductive material in the conductive ink. Methods of induction heating are known in the art and include microwave heating that stimulates or excites the conductive material in the traces to provide localized heating of the traces and the thermoplastic substrate adjacent the trace. If induction heating is used, the thermoplastic substrate can be heated to a temperature above or about equal to a softening temperature adjacent to the conductive traces. That is, it is not necessary that the entire thermoplastic substrate be heated in this step, but only the substrate adjacent to the conductive traces. Induction heating is more efficient and allows portions of the circuit element to be unaffected by the embedding step, including the thermoplastic substrate that is not adjacent to a trace.

Figure 6:
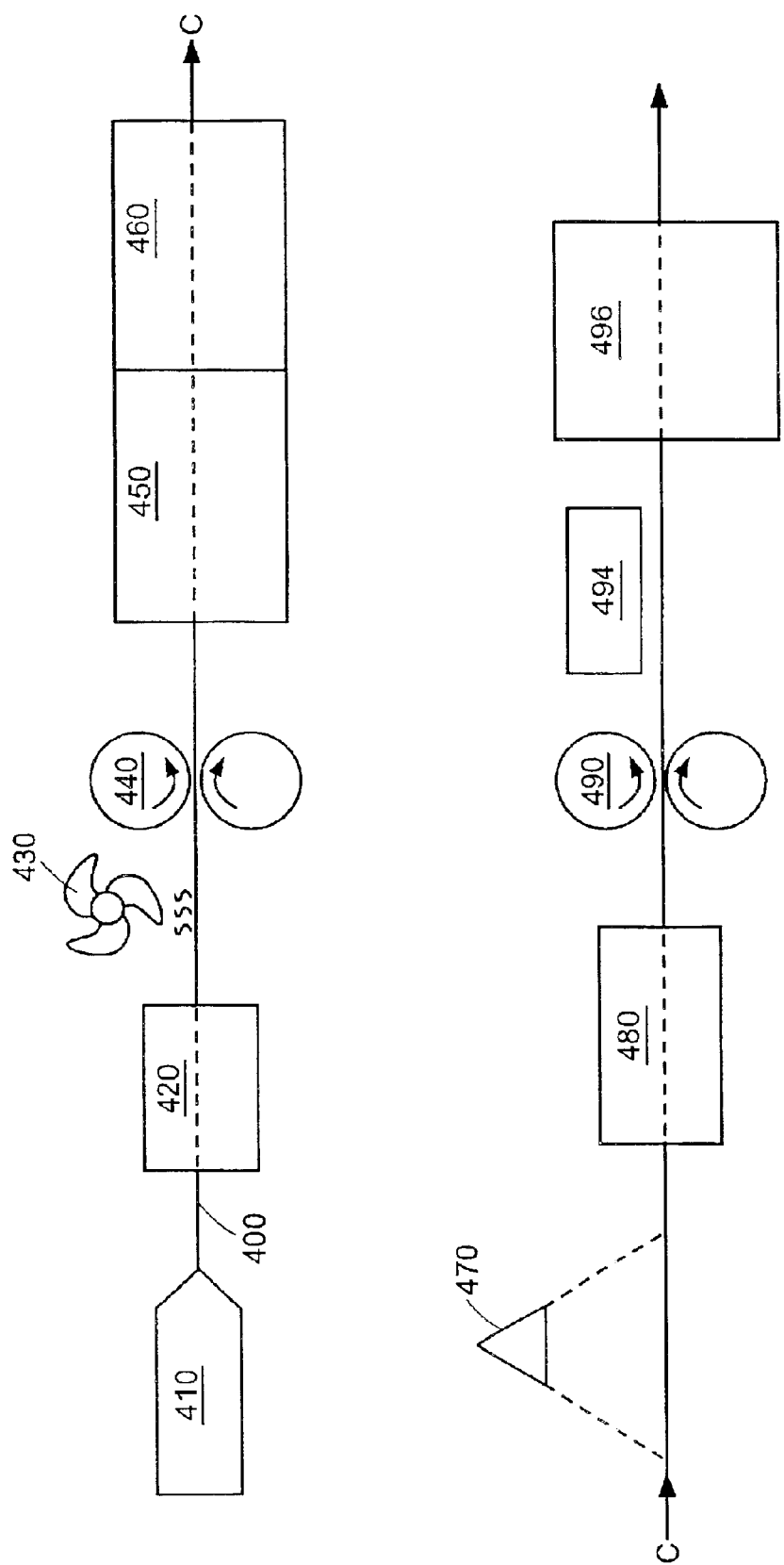
FIG. 6 is another schematic representation of another exemplary method of forming a circuit element of the present invention.

FIG. 6 is a schematic representation of another exemplary method of forming a circuit element of the present invention. The method includes providing the substrate layers 400. The substrate layers include a thermoplastic substrate having a softening temperature ($T_S$) and a second substrate coextruded from a co-extruder 410. The substrate layers 400 then are preheated in an oven 420 to a temperature above or about the $T_S$ and cooled to room temperature by a fan 430. Conductive ink then is printed onto the thermoplastic substrate using printer a 440. The conductive ink is dried in an oven 450 at a temperature less than the $T_S$. The conductive trace then is embedded in the thermoplastic substrate by heating the thermoplastic substrate to a temperature at or above the $T_S$ in another oven 460. Subsequently, the thermoplastic substrate is cross-linked at an electron beam radiation station 470, and the conductive traces are plated in electrochemical plating bath 480. Finally, a solder paste is printed onto the circuit element by printer 490, surface mounted devices are applied to at the solder pads at station 494, and the surface mounted devices are mired in the solder when it is melted in the reflow furnace 496. Upon cooling, the surface mounted devices will be affixed to the circuit element by the hardened solder.

The methods of the present invention can include the steps of heating the thermoplastic substrate to a temperature above or about equal to the $T_S$, and then allowing it to cool back to room temperature, prior to printing the conductive ink. Conductive traces formed on such "preheated" thermoplastic substrates generally are more conductive than conductive traces formed on thermoplastic substrates that are not preheated. Further, more ink is deposited on preheated thermoplastic substrates than on substrates that are not preheated. It is not required by the present invention that the thermoplastic substrate be allowed to cool. However, when heated substrates are not suitable for printing at the preheat temperature, the substrate can be allowed to cool to a temperature suitable for printing. The preheated thermoplastic substrate then can be printed with conductive ink, and the conductive trace embedded in the substrate using any variation and combination of the methods for doing so described above and/or below.

Without wishing to be bound to any particular theory, it is believed that the preheating step renders the thermoplastic substrate less crystalline so that more ink is deposited on the thermoplastic substrate during the printing step. It has been observed that the ink transfer to a ethylene vinyl acetate thermoplastic substrate increases about 50% when the layer is preheated to about 250° F. (121° C.) and allowed to cool to room temperature prior to printing, as compared to when it is not preheated. In addition, a drop in resistance of about 18% has been observed between conductive traces formed on preheated versus non-preheated ethylene vinyl acetate substrates, which were both dried at about 150° F. (66° C.), and then embedded at about 250° F. (121° C.). This drop in resistance is in addition to the drop in resistance of about 50% when the conductive trace is embedded in the thermoplastic substrate.

Where increased conductivity is desired, methods of the instant invention can further include the step of electrolytically plating the conductive traces, e.g., with copper, to form conductive plating on the conductive trace. The conductive trace can be electrolytically plated using methods known in the art. Plating can also provide the added benefit of bridging any small voids or gaps in the conductive trace. Plated circuit elements of the present invention have demonstrated adhesion in excess of industry standards for further processing and use.

Surface mounted devices can be mounted on a circuit element of the present invention. For example, solder in the form of a paste or ink can be applied to the circuit element to form solder pads at predetermined places where devices are to be mounted by conventional methods such as screen printing with a mask, solder paste, and squeegee. The surface mounted devices then can be placed on the circuit element at predetermined places dictated by the circuit design. The circuit element then can be passed through a reflow oven or furnace to melt or reflow the solder. Reflow temperatures vary depending on the solder formula, and typically are provided for commercial solders. Generally, the solder reflow temperature is about 250° C. When the circuit element is removed from the furnace and cools, the solder hardens and the devices are affixed to the board at the solder pads.

The thermoplastic substrate, a second layer and/or any additional substrate layers can be cross-linked prior to exposure to solder reflow temperatures or other high temperatures experienced in further processing and/or use. Cross-linking can be employed for various reasons, e.g., if any of the substrate layers cannot withstand the temperatures experienced in the reflow oven, if the thermoplastic substrate will exhibit sufficient flow to reduce the adhesion of or otherwise disrupt the embedded traces to the thermoplastic substrate, and/or if the reflow temperature might otherwise compromise the integrity of the traces and/or the substrate layers. Preferably, the substrate is cross-linked after the conductive trace has been embedded because cross-linking can in some instances render the thermoplastic substrate resistant to embedding. The substrate can be cross-linked by a variety of known methods such as exposure to UV radiation, gamma radiation, and electron beam radiation.

A preferred method of cross-linking is electron beam radiation because it is self-propagating unlike other techniques, e.g., UV radiation that requires an initiator for cross-linking to occur. The circuit element can be exposed to electron beam radiation by passing it under or through an electron beam curing station. For example, the circuit element can be exposed to electron beam radiation from about 3 to about 7 MRads at a belt speed of 20 ft/min, but the exposure dosage and belt speed can be adjusted to accommodate the printing process used and the desired degree of cross-linking.

Thermoplastic substrates formed from ethylene vinyl acetate and ethylene ethyl acetate have been exposed to electron beam radiation at 5 MRads at a belt speed of 20 ft/min after a conductive trace has been embedded in the substrate and before exposure to a reflow oven. Prior to cross-linking, the substrate layers cannot withstand a reflow temperature of 250° C. and they warp and buckle upon exposure to the reflow temperature. After cross-linking, it is expected that the circuit element will not warp or buckle upon exposure to the reflow temperature.

Even if the circuit element will not be subjected to a reflow oven, if it must withstand high temperatures in further processing or in use, e.g., to increase environmental cross-resistance in high temperature application or devices like an automobile engine, it can be linked in the same fashion to increase its stability at high temperatures. There are numerous additional processing steps that the circuit elements of the present invention can be incorporated into, such as cropping and drilling, that are contemplated by the present invention.

Preferably, if the circuit elements are packaged, a release liner is placed between each circuit element to prevent the transfer of the conductive traces or the substrate layers if either or both are tacky. Circuit elements can be bundled and wrapped in shrink-wrap to discourage movement and damage to the circuit elements.

It should be understood that the individual steps of the invention can occur simultaneously and/or in any order as long as the invention remains operable. The methods of the present invention can be used to create a conductive pattern on the surface of any circuit element including, but not limited to, conductors, resistors, capacitors, security tags, antennas, contacts, and lands. The circuit element can be or form part of a rigid, flexible or rigid-flex circuit layer. It can be incorporated into a single or double-sided circuit layer or assembly, a printed wiring board or wiring board assembly, or a multi-layer printed circuit or wiring board. In addition, methods of the present invention can be used to create conductive patterns on the surfaces of circuit elements to be used as internal and/or external circuit elements. The circuit elements of the present invention can be used in any application where circuit elements are used.

EXAMPLE 1

Formation of an Exemplary Circuit Element

A 3 mil polyester layer hot melt coated with a 2 mil ethylene vinyl acetate (EVA) polymer layer was obtained from McIntire Business Products (Concord, N.H.). The EVA substrate has a softening temperature of less than about 250° F. (121° C.). The EVA/polyester composite was preheated to about 250° F. (121° C.) in an oven, then allowed to cool to room temperature. The EVA thermoplastic substrate surface then was printed with conductive ink using a letterpress printer using standard methods. The conductive ink was made by mixing the following ingredients: (i) approximately 75.7 weight % silver particles sold under the trade designation RA15 from Metalor Technologies (Attleboro, Mass.), (ii) approximately 20 weight % alkylated resin obtained from Lawter International (Kenosha, Wis.); (iii) approximately 4 weight % aliphatic hydrocarbon solvent obtained from Exxon Corporation (Belgium); and (iv) approximately 0.3 weight % eugenol antioxidant (also known as clove oil) obtained from Aldrich Chemicals (Milwaukee Wis.).

The traces were printed three times. After each printing, the conductive ink was dried at about 150° F. (66° C.) in an oven. Subsequently, the printed circuit element was heated to about 250° F. (121° C.) and allowed to cool. The printed circuit element was then plated with copper by a commercial plater using standard electrolytic plating methods. The resistance of the traces was measured at about 1.5 ohms/square prior to plating. After electroplating, Scotch® tape grade 8–10 was applied to its printed surface and removed from the circuit element, and the electrolytic plating and conductive traces were observed to be stable and strongly bonded to the circuit element.

EXAMPLE 2

Formation of Another Exemplary Circuit element

A KAPTON® polyimide substrate from about 2 $\mu$m to about 5 $\mu$m thick from I.E. du Pont de Nemours and Company (Circleville, Ohio), was printed one time with conductive ink using a letterpress printer using standard methods. The conductive ink was formulated using the same resin, solvent, and antioxidant in the same ratio as described in Example 1, and adjusted so that these ingredients combined comprised approximately 20 weight % of the mixture. Added to this vehicle was approximately 60 weight % P204-3 silver flakes having a particle size distribution substantially between about 1 μm and about 8 μm from Mettalor (Attleboro, Mass.), and approximately 20 weight % C-0083P powder having a particle size distribution substantially between about 0.4 μm and about 4 μm, and having a mean value of about 1.2 μm, from Mettalor (Attleboro, Mass.).

After printing, the conductive ink was dried at about 150° F. for about 2 to about 5 minutes in an oven. Subsequently, the printed substrate was heated in an oven at a temperature of about 500° F. for about 20 to about 30 minutes, and allowed to cool. A standard Scotch® tape test was run on the circuit board and the resistance of the conductive trace measured. The conductive traces were observed to be stable and strongly bonded to the substrate. The resistance was measured at about 86 milliOhms/square, a significant drop as compared to the resistance of the traces of Example 1.

EXAMPLE 3

Preparation of an Exemplary Conductive Ink

A conductive ink was prepared by mixing in a 3-roll grinding mill from Koenen GmbH (Germany), the following ingredients: (i) approximately 80 weight % P254-1 silver pigment from Metalor Technologies (Attleboro, Mass.); (ii) approximately 18 weight % XV 1578 alkyd resin Lawter International (Kenosha, Wis.); and approximately 2 weight % EXX-PRINT® M71a aliphatic and aromatic hydrocarbon solvent from Exxon Corporation (Houston, Tex.).

EXAMPLE 4

Preparation of Exemplary Circuit Elements Varying Processing Conditions and Substrates Used The conductive ink of Example 3 was printed on the thermoplastic substrates listed in Table 1. As can be seen from Table 1, many of the thermoplastic substrates were affixed to a second substrate formed from polyester. The polyester substrates were obtained from I.E. du Pont de Nemours and Company (Circleville, Ohio). The polycarbonate (PC)/polyester, ethylene vinyl acetate (EVA)/polyester, and ethylene ethyl acetate (EEA)/polyester substrates were obtained from General Binding Corporation (Skoke, Ill.). The polyethylene (PE)/polyester substrate was obtained from Felix Schoeller (Pulaski, N.Y.).

The thermoplastic substrates were printed with the conductive ink of Example 3 using a technique designed to mimic a variety of printing methodologies, including letterpress and off-set lithography. The ink was distributed on an ink train and offset to a printing blanket. The printing blanket was removed from the ink train and put into contact with a pressure roll set at a pressure between about 10 and about 24 KgF. The thermoplastic substrates then were printed with the conductive ink by passing the substrate layers between the ink blanket and the pressure roller.

All of the substrates, except for the one-layer polyester substrate, were printed with and without a prior preheat step, wherein the substrates were preheated to about 250° F. and cooled to room temperature prior to printing. After printing, the circuit elements were placed in an oven heated to about 150° F. for about 10 minutes, and then placed in an oven heated to about 250° F. for about 10 minutes. The circuit elements were cooled to room temperature and the electrical resistance was measured using a Ballantine Four-Point Probe by Ballantine (Calif.). The optical transmission was measured using a TRI-4 Densitometer from Tobias Associates (Ivyland, Pa.). Optical transmission is used as a gauge of the amount of ink transferred to the substrate.

TABLE 1

Performance of Varied Substrates Upon Pre-Heat, Drying and Embedding Conductive Traces

| Substrate Layers With Print Side Last | Preheated Substrate (250° F.) | Resistance after Drying at 150° F. (mohms/square) | Resistance after Embedding at 250° F. (mohms/square) | Optical Transmission (%) |
|---|---|---|---|---|
| Polyester/PC | N | 700 | 493 | 0.0442 |
|  | Y | 707 | 486 | 0.0263 |
| Polyester | N | >20 × $10^9$ | >20 × $10^9$ | 0.0069* |
| Polyester/EVA | N | 535 | 393 | 0.0302 |
|  | Y | 407 | 329 | 0.0123 |
| Polyester/EEA | N | 393 | 256 | 0.0204 |
|  | Y | 436 | 292 | 0.0130 |
| Polyester/PE | N | >20 × $10^9$ | 113 × $10^3$ | — |
|  | Y | >20 × $10^9$ | 5.93 × $10^3$ | — |

*biased by silver reflection

The results demonstrate the benefits of forming a conductive trace on a thermoplastic substrate material in accordance with the present invention. The results also demonstrate the benefit of preheating the thermoplastic substrate and embedding the conductive traces, rather than just drying the traces on the substrate. The lowest resistance was achieved using a thermoplastic substrate formed from ethylene ethyl acetate affixed to a polyester substrate without preheat and exposed to 150° F. for 10 minutes and 250° F. for 10 minutes. Generally, however, a preheat step increases the amount of ink transferred to the substrate and decreases the electrical resistance of the conductive traces.

Throughout the present disclosure, where compositions, apparatus and methods are described as including or comprising specific components, elements, devices or steps, it is contemplated that compositions, apparatus and methods of the present invention also consist essentially of, or consist of, the recited components, elements, devices or steps.

The invention can be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes that come within the meaning and range of equivalency of the claims are intended to be embraced therein.

What is claimed is:

1. A circuit element comprising:
   a thermoplastic substrate having a softening temperature less than about 250° F.;
   a conductive trace at least partially embedded in the thermoplastic substrate; and
   a second substrate disposed adjacent to the thermoplastic substrate and opposite the conductive trace, wherein the second substrate has a second softening temperature that is higher than the softening temperature of the thermoplastic substrate.

2. The circuit element of claim 1 wherein the thermoplastic substrate is formed from a polymer selected from the group consisting of polyethylene, polyethylene naphthalate, synthetic paper, polystyrene, and copolymers and combinations thereof.

3. The circuit element of claim 1 wherein the thermoplastic substrate is hot melt coated, co-extruded or laminated onto the second substrate.

4. The circuit element of claim 1 wherein the second substrate is formed from a material selected from the group consisting of polyimide, polyethylene naphthalate, polyphenylene sulfide, polyester, synthetic paper, polystyrene, copolymers thereof, metal, metal foils, glass, silica, and combinations thereof.

5. The circuit element of claim 1 further comprising a third substrate, wherein the third substrate is disposed adjacent to the second substrate opposite the thermoplastic substrate.

6. The circuit element of claim 5 wherein the third substrate is a third thermoplastic substrate, and the circuit element further comprises a conductive trace at least partially embedded in the third thermoplastic substrate.

7. The circuit element of claim 1 wherein the conductive trace comprises a plurality of conductive particles having a particle size distribution having at least two modes.

8. The circuit element of claim 7 wherein the conductive particles comprise a conductive powder and a plurality of conductive flakes, the conductive flakes having a mean aspect ratio between about 2 and about 50.

9. The circuit element of claim 1 wherein the conductive trace comprises a plurality of conjugated conductive particles.

10. The circuit element of claim 1 comprising an electrolytic conductive plating disposed on the conductive trace.

11. The circuit element of claim 1 further comprising a protective coating disposed on a surface of the circuit element.

12. A circuit element comprising:
    a thermoplastic substrate selected from the group consisting of ethylene vinyl acetate, ethylene ethyl acetate, polyethylene, polypropylene, polycarbonate, polyethylene napthalate, polyester, synthetic paper and polystyrene;
    a conductive trace at least partially embedded in the thermoplastic substrate; and
    a second substrate disposed adjacent to the thermoplastic substrate and opposite the conductive trace, wherein the second substrate has a second softening temperature that is higher than the softening temperature of the thermoplastic substrate.

13. The circuit element of claim 12 wherein the thermoplastic substrate is ethylene vinyl acetate.

14. The circuit element of claim 12 wherein the thermoplastic substrate is ethylene ethyl acetate.

15. The circuit element of claim 12 wherein the thermoplastic substrate is polyethylene.

16. The circuit element of claim 12 wherein the thermoplastic substrate is polypropylene.

17. The circuit element of claim 12 wherein the thermoplastic substrate is polycarbonate.

18. The circuit element of claim 12 wherein the thermoplastic substrate is polyethylene napthalate.

19. The circuit element of claim 12 wherein the thermoplastic substrate is polyester.

20. The circuit element of claim 12 wherein the thermoplastic substrate is synthetic paper.

21. The circuit element of claim wherein the thermoplastic substrate is polystyrene.

* * * * *